United States Patent
Katsuki et al.

(10) Patent No.: US 6,690,258 B2
(45) Date of Patent: Feb. 10, 2004

(54) SURFACE-MOUNT POSITIVE COEFFICIENT THERMISTOR AND METHOD FOR MAKING THE SAME

(75) Inventors: Takayo Katsuki, Omihachiman (JP); Masanori Nishibori, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/090,157

(22) Filed: Mar. 5, 2002

(65) Prior Publication Data

US 2002/0175801 A1 Nov. 28, 2002

(30) Foreign Application Priority Data

Apr. 5, 2001 (JP) .................................... 2001-107087

(51) Int. Cl.[7] ................................................. H01B 7/13
(52) U.S. Cl. ................. 338/22 R; 338/315; 338/59; 338/60; 338/324
(58) Field of Search ................. 338/22 R, 225 D, 338/59, 60, 329, 324, 315

(56) References Cited

U.S. PATENT DOCUMENTS

| | | | | | |
|---|---|---|---|---|---|
| 4,431,983 | A | * | 2/1984 | Rodriguez | 338/220 |
| 4,635,026 | A | * | 1/1987 | Takeuchi | 338/22 SD |
| 4,991,059 | A | * | 2/1991 | Kiyose | 361/773 |
| 5,337,038 | A | * | 8/1994 | Taniguchi et al. | 338/22 R |
| 5,726,623 | A | * | 3/1998 | Camp | 338/22 R |
| 5,777,541 | A | * | 7/1998 | Vekeman | 338/22 R |
| 5,990,779 | A | * | 11/1999 | Katsuki et al. | 338/22 R |
| 6,489,880 | B2 | * | 12/2002 | Miyazaki et al. | 338/22 R |

* cited by examiner

*Primary Examiner*—Karl D. Easthom
(74) *Attorney, Agent, or Firm*—Keating & Bennett, LLP

(57) ABSTRACT

A surface-mount positive coefficient thermistor includes a plate-like positive coefficient thermistor element, a pair of electrodes on the respective two main surfaces of the positive coefficient thermistor element, a pair of metal terminals each having a cutout at one end region connected to the corresponding electrode, the metal terminals including a metal having a low thermal conductivity, and solders each connecting the end region of the corresponding metal terminal to the outermost layer of the corresponding electrode. The metal terminal is readily and uniformly soldered to the electrode in a short period of time.

18 Claims, 5 Drawing Sheets

SURFACE-MOUNT POSITIVE COEFFICIENT THERMISTOR AND METHOD FOR MAKING THE SAME

BACKGROUND OF THE INVENTION

1. Field of the Invention

The present invention relates to surface-mount positive coefficient thermistors for use in, for example, protecting exchanges and telephones from overcurrents.

2. Description of the Related Art

FIGS. 4A and 4B show a surface-mount positive coefficient thermistor 1 which includes a surface-mount type disc positive coefficient thermistor element 2. A pair of electrodes 3 is provided on two main surfaces of the disc positive coefficient thermistor element 2. Each electrode 3 includes a nickel-plated underlayer 3a and a silver-baked outermost layer 3b. Furthermore, one end 4a of a pair of metal plate terminals 4 are connected to each outermost layer 3b via solder 5. The metal terminals 4 are made of nickel silver or stainless steel and are plated with tin. The other end of each metal terminal 4 is connected to an electric circuit (not shown) on a board with solder.

In the surface-mount positive coefficient thermistor 1, the metal terminal 4 and the electrode 3 are connected by the solder 5 by a reflow soldering process which includes applying a solder paste between one end 4a of the metal terminal 4 and the electrode 3, heating to melt the paste 5 in a reflow furnace, and then cooling the melt to bond the electrode 3 to the metal terminal 4.

In the metal terminal 4 which is made of a material having a low thermal conductivity, such as nickel silver or stainless steel, heat that is applied to one end 4a during soldering does not significantly transfer to the other end 4b. Since the other end 4b is not oxidized, the solderability to the board does not substantially decrease.

The metal terminal 4 made of such a low-thermal conductivity material, however, precludes heat transfer from the end 4a to the solder 5 and the solder 5 is difficult to melt.

Thus, the solder 5 does not completely melt during a short heating time, resulting in low bonding strength between the metal terminal 4 and the electrode 3. If heat is applied for a sufficiently long time to completely melt the solder 5, the end 4a of the metal terminal 4 is discolored and the plated-tin is oxidized, resulting in substantial deterioration of wettability of the solder when a board is mounted.

Referring to FIG. 5, horizontal arrows represent thermal conduction in the solder 5. Applied heat does not rapidly transfer to the center of the solder 5, thus precluding uniform heating.

SUMMARY OF THE INVENTION

In order to overcome the above-described problems, preferred embodiments of the present invention provide a metal terminal that is configured to allow adequate and uniform heating when the metal terminal is soldered to an electrode, and a method for making a surface-mount positive coefficient thermistor including such a novel metal terminal.

According to a preferred embodiment of the present invention, a surface-mount positive coefficient thermistor includes a plate-like positive coefficient thermistor element, a pair of electrodes on the two main surfaces of the positive coefficient thermistor element, each electrode including at least two layers, a pair of metal terminals each having a cutout at one end region thereof connected to the corresponding electrode, the metal terminals being made of a metal having a low thermal conductivity, the end region of each metal terminal being connected to the outermost layer of the corresponding electrode, the outermost layer of the electrode being exposed at the cutout, and solder connecting the end region of the corresponding metal terminal to the outermost layer of the corresponding electrode.

Preferably, each of the electrodes includes a first layer of nickel as the primary component and a second layer of silver as the primary component, the area of the second layer is less than that of the first layer such that the peripheral edge of the second layer is spaced from the peripheral edge of the corresponding main surface.

Preferably, the metal terminal includes at least one material selected from stainless steel and silver nickel.

Preferably, the metal terminals are subjected to a plating treatment to enhance solderability.

Preferably, the solder overflows the cutout onto the outer surface of the metal terminal.

According to another preferred embodiment of the present invention, a method for making a surface-mount positive coefficient thermistor includes the steps of preparing a plate-like positive coefficient thermistor element, forming electrodes on the two main surfaces of the positive coefficient thermistor element, preparing a pair of metal terminals, forming a cutout at an end of each of the metal terminals, and applying solder between the respective ends of the metal terminals and the respective electrodes, and then melting by heating the solder to connect the metal terminals to the respective electrodes.

Preferably, the solder is melted by heat from a near infrared heat beam.

In a surface-mount positive coefficient thermistor, a large impact is applied from the top during mounting as compared with a lead type positive coefficient thermistor. Thus, secure bonding between the thermistor element and the metal terminals is required. According to preferred embodiments of the present invention, the cutout provided at one end of each metal terminal facilitates direct heating of the solder provided under the metal terminal. Thus, the solder is adequately and uniformly heated and melted. Furthermore, the solder overflows the cutout into the outer surface of the metal terminal, resulting in greatly improved bonding between the metal terminal and the electrode.

Furthermore, in the surface-mount positive coefficient thermistor which is exposed to a higher temperature environment when it is mounted onto a circuit board, a solder having a higher melting point must be used for bonding the metal terminal with the electrode. In preferred embodiments of the present invention, a near infrared heat beam is used to heat the solder rapidly to a high temperature. Since the metal terminal is not substantially oxidized, the solder has satisfactory wettability when the thermistor is mounted onto a circuit board.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1A:
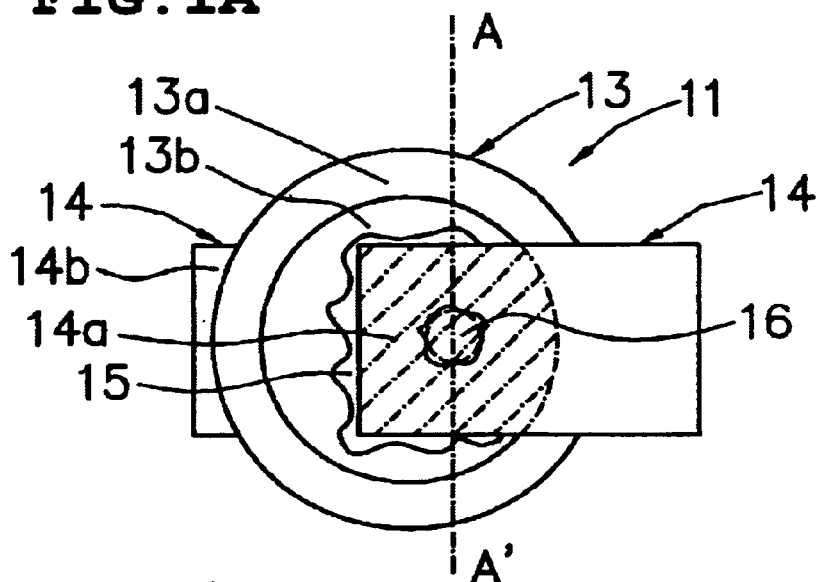
FIGS. 1A, 1B, and 1C are a plan view, a longitudinal cross-sectional view, and a bottom view, respectively, of a surface-mount positive coefficient thermistor according to a preferred embodiment of the present invention.
Figure 1B:
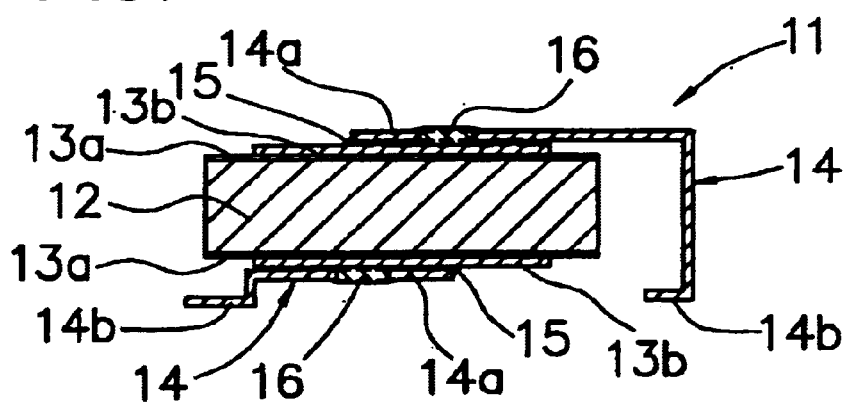
Figure 1C:
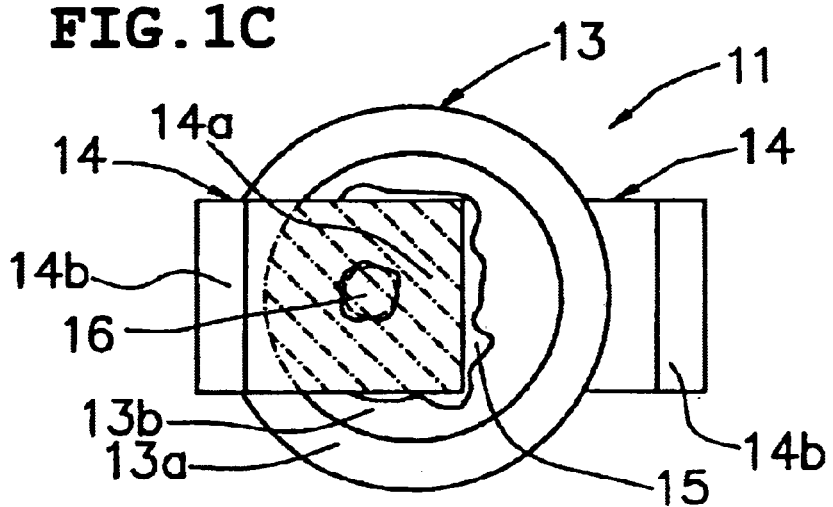
Figure 2A:
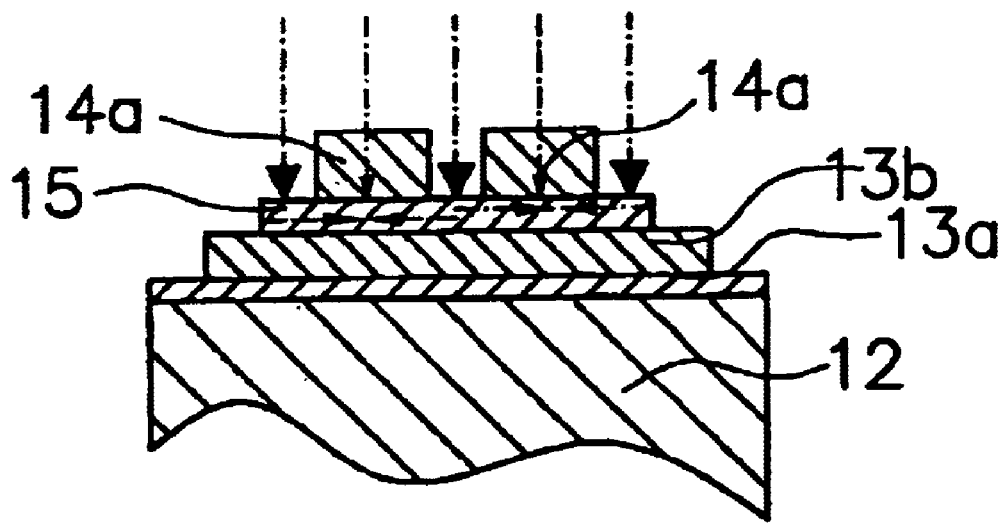
FIGS. 2A and 2B are cross-sectional views taken along sectional line II—II and showing a state of the surface-mount positive coefficient thermistor heated for soldering and a state of the solder melted by the heat, respectively.
Figure 2B:
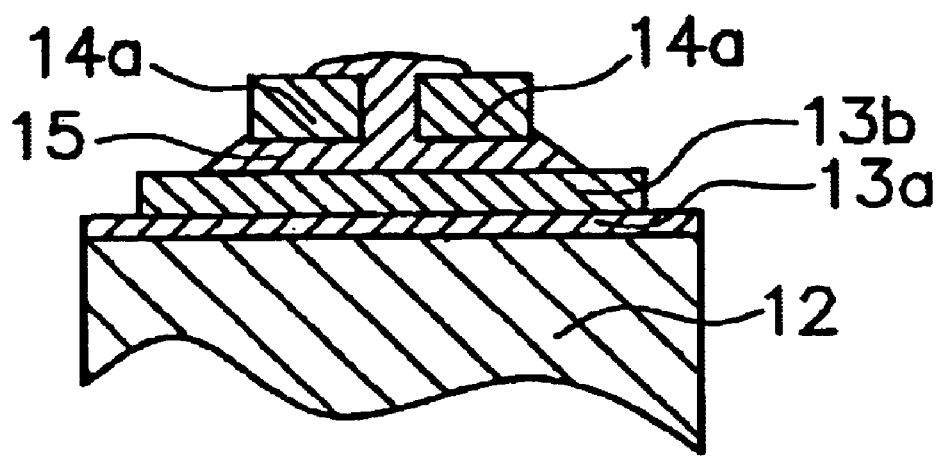

A preferred embodiment of the present invention will now be described with reference to FIGS. 1A, 1B, and 1C.

A surface-mount positive coefficient thermistor 11 preferably includes a plate-like positive coefficient thermistor element 12, a pair of opposing electrodes 13 provided on the two main surfaces of the disc positive coefficient thermistor element 12, a pair of metal terminals 14 connected to the respective electrodes 13, and solders 15. Each solder 15 connects one end 14a of the corresponding metal terminal 14 to the corresponding electrode 13. The other end 14b of the metal terminal 14 is connected to an electric circuit on a board with solder or other suitable material (not shown in the drawing). The metal terminal 14 has a hole 16 at the end 14a such that the solder 15 overflows the hole 16 onto the outer surface of the metal terminal 14.

The surface-mount positive coefficient thermistor 11 is preferably made by the following method.

A green disk compact is formed by a dry process using a thermistor material primarily including a barium titanate ceramic semiconductor and having a positive coefficient and is fired to prepare a positive coefficient thermistor element 12, which has a diameter of about 8 mm, a thickness of about 2 mm, a resistance of about 20 Ω, and a Curie temperature of about 120° C.

Electrodes 13 are formed on the main surfaces of the positive coefficient thermistor element 12 via the method described below. Underlayers 13a are formed on the entire main surfaces of the positive coefficient thermistor element 12 by electroless plating of nickel to ensure ohmic contacts on the main surfaces. Outermost layers 13b including silver paste are formed by baking onto the respective underlayer 13a to ensure solderability of the electrodes 13. The area of the outermost layers 13b is preferably less than the area of the underlayers 13a. Thus, a space is provided between the peripheral edge of each outermost layer 13b and the peripheral edge of the corresponding main surface of the positive coefficient thermistor element 12. For example, the outermost layer 13b has a diameter of, for example, about 6 mm in this preferred embodiment.

Next, an example of the metal terminals 14 according to preferred embodiments of the present invention are prepared as described below. A stainless steel metal plate having a thickness of about 0.15 to about 0.2 mm and a width of about 4 mm is plated with nickel (thickness: about 0.5 to about 1 μm) and then with a Sn(about 90%)—Pb(about 10%) solder (thickness: about 3 to about 5 μm), and is processed to have a cross-section having a substantially L shaped configuration, as shown in FIG. 1B.

A hole 16 is formed substantially in the approximate center of one end region 14a (hatched in FIG. 1A or 1C) of each metal terminal 14 by punching or other suitable method at which the end region 14a of the metal terminal 14 is connected to the outermost layer 13b of the corresponding electrode 13. The hole is substantially perpendicular to the electrode surface and preferably has a diameter of about 1 mm.

A solder paste is applied between the end 14a of each metal terminal 14 and the outermost layer 13b of the corresponding electrode 13. The solder paste is melted with a near infrared heat beam and then is cooled to fix the end 14a of the metal terminal 14 and the electrode 13.

The amount of the solder 15 is adjusted such that the melted solder overflows the hole 16 onto the outer surface of the metal terminal 14.

Also, a known surface-mount positive coefficient thermistor 1 is prepared in which each metal terminal 4 does not include a hole 16 and is fixed to an corresponding electrode 3 by reflow soldering. This surface-mount positive coefficient thermistor 1 is compared with the surface-mount positive coefficient thermistor 11 according to preferred embodiments of the present invention. The results are shown in Table 1.

TABLE 1

| | Heating Time (sec) | State of Solder | Discoloring of Metal Terminal | Bonding Strength |
|---|---|---|---|---|
| EXAMPLE | 30 | Melted | Not observed | 19 N |
| COMPARATIVE EXAMPLE | 30 | Not melted | Not observed | — |
| COMPARATIVE EXAMPLE | 120 | Melted | Observed | 18 N |

Table 1 demonstrates that the solder 5 of the known surface-mount positive coefficient thermistor 1 is not completely melted during a heating time of about 30 seconds, resulting in unsuccessful connection between the metal terminal 4 and the electrode 3. Furthermore, the plated tin at the end 4b of the metal terminal 4 is discolored by oxidation during a prolonged heating time of about 120 seconds though the connection is completed due to melting of the solder 5.

In contrast, in the surface-mount positive coefficient thermistor 11 according to preferred embodiments of the present invention, the solder is melted during a heating time of about 30 seconds to completely and reliably connect the metal terminal 14 to the electrode 13 by soldering. The end 14b of the metal terminal 14 is not discolored.

This is because the hole 16 at the end 14a of the metal terminal 14 of the surface-mount positive coefficient thermistor 11 enables effective heating of the solder 15. Furthermore, the near infrared heat beam from a halogen lamp intensely heats the end 14a of the metal terminal 14.

Figure 3A:
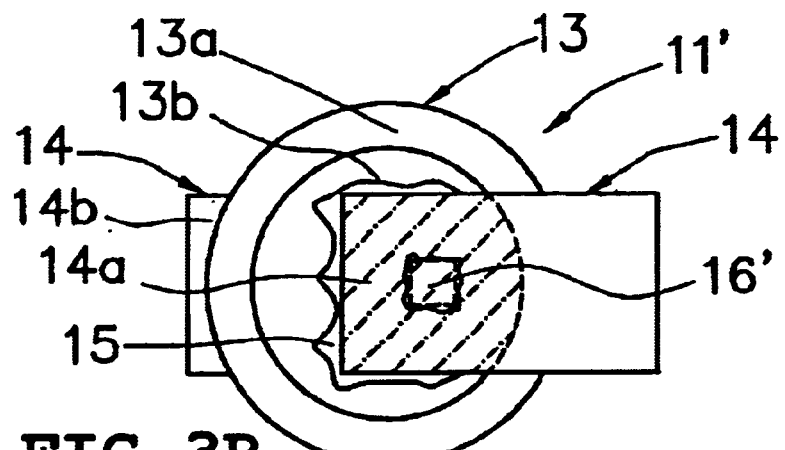
FIGS. 3A, 3B, and 3C are plan views of a surface-mount positive coefficient thermistor having a substantially rectangular hole in a metal terminal, a surface-mount positive coefficient thermistor having a plurality of substantially circular holes in a metal terminal, and a surface-mount positive coefficient thermistor having a cutout in a metal terminal, respectively.
Figure 3B:
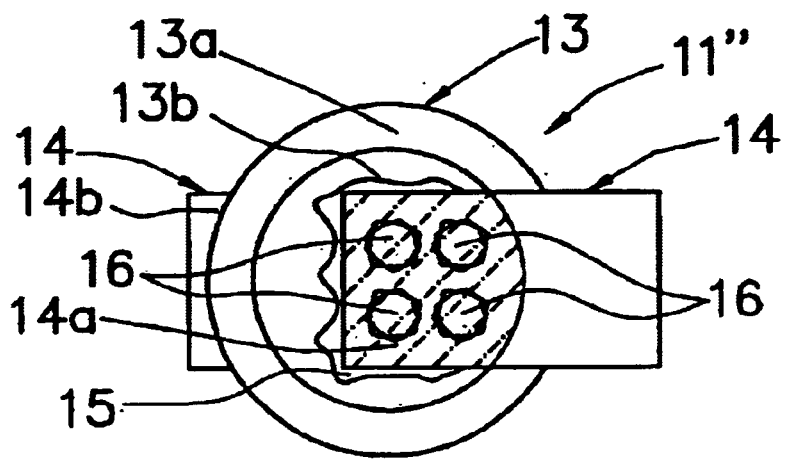
Figure 3C:
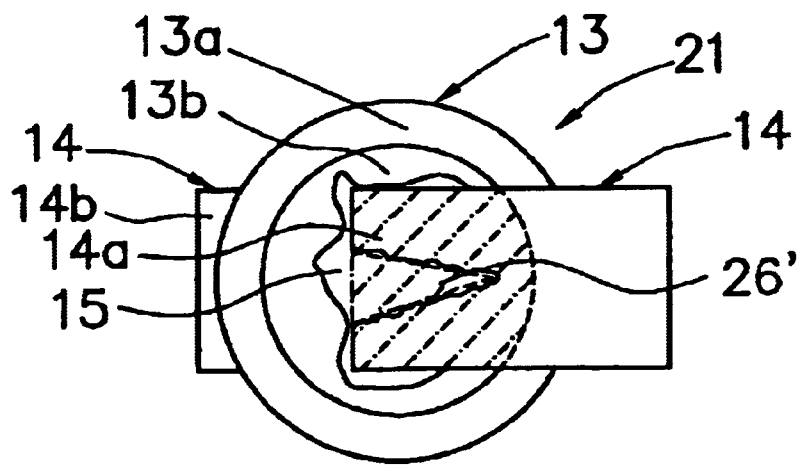
Figure 4A:
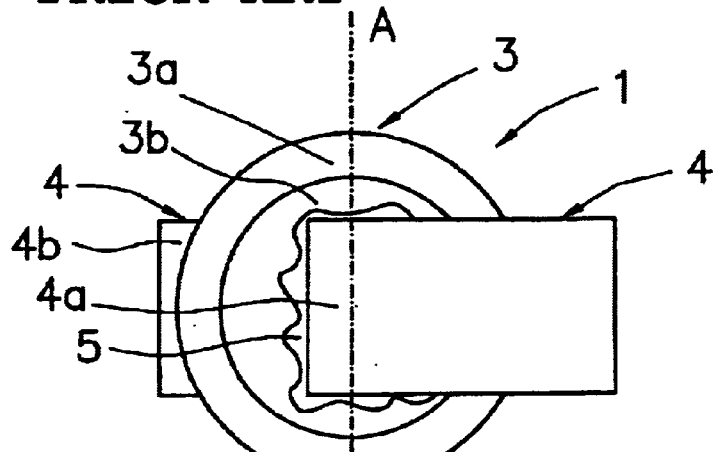
FIGS. 4A, 4B, and 4C are a plan view, a longitudinal cross-sectional view, and a bottom view, respectively, of a known surface-mount positive coefficient thermistor.
Figure 4B:
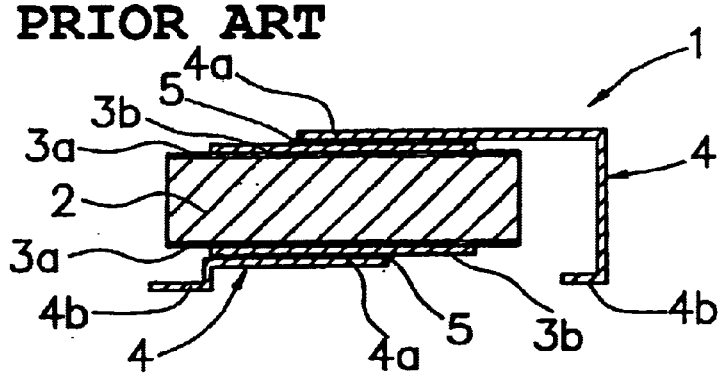
Figure 4C:
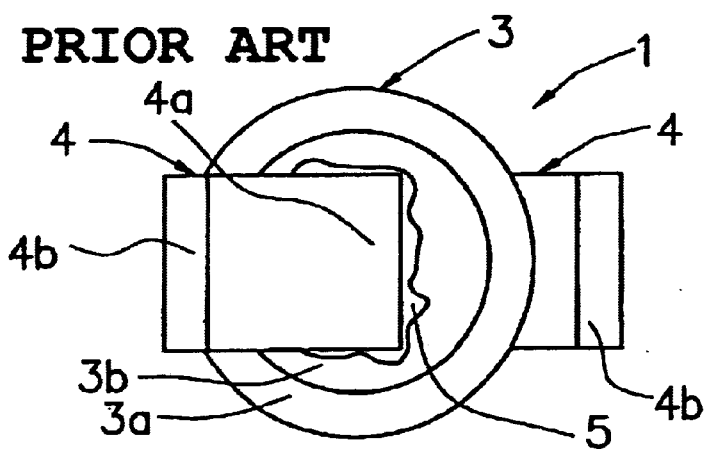
Figure 5:
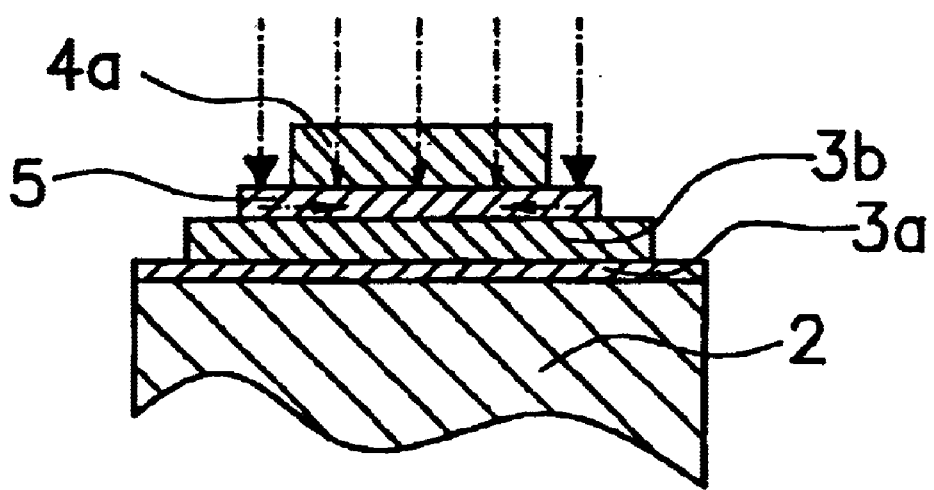
FIG. 5 is a cross-sectional view taken along sectional line V—V and showing a state of the surface-mount positive coefficient thermistor heated for soldering.

In the above-described preferred embodiment, a single substantially circular hole 16 is provided at the end 14a of the metal terminal 14. As shown in FIG. 3A (a surface-mount positive coefficient thermistor 11'), a noncircular hole 16' may be provided instead of the substantially circular hole 16. Alternatively, as shown in FIG. 3B (a surface-mount positive coefficient thermistor 11"), a plurality of holes 16 may be provided therein. Alternatively, as shown in FIG. 3C (a surface-mount positive coefficient thermistor 21), a cutout 26 other than the hole 16 may be provided. In the present invention, the term "cutout" includes any of the above.

The holes 16 and 16' and the cutout 26 must be formed in the end region 14a (hatched section in FIGS. 1A, 1C, and 3A to 3C) connected to the outermost layer 13b of the electrode 13 because the outermost layer 13b including nickel is oxidized when the silver paste is baked. The oxidized outermost layer 13b cannot be connected to the end 14a of the metal terminal 14 with an ordinary solder paste.

The metal terminal 14 is preferably made of stainless steel in the above-described preferred embodiment. In the present invention, a metal terminal 14 including a metal having a low thermal conductivity is preferably used. Examples of such metals are nickel silver and stainless steel.

When a metal terminal 14 having a low thermal conductivity is connected to the outermost layer 13b of the electrode 13 with solder, the metal terminal 14 is not rapidly heated, resulting in a large difference in temperature between the outer surface and the inner surface of the metal terminal 14. Thus, the surface plating layer must be exposed at high temperatures for a long period of time until the solder paste at the inner surface is melted. In such a state, the surface of the metal terminal 14 is discolored and oxidized, resulting in a decrease in solderability.

However, in preferred embodiments of the present invention, a cutout is provided in one end region 14a, which is connected to the electrode, of the metal terminal 14, and a near infrared heat beam is used. Thus, a sufficiently high bonding strength is rapidly achieved for a short time.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface-mount positive coefficient thermistor comprising:
    a plate-like positive coefficient thermistor element;
    a pair of electrodes provided on two main surfaces of the positive coefficient thermistor element, each of the pair of electrodes including at least two layers;
    a pair of metal terminals each having a cutout at one end region thereof connected to a corresponding one of the pair of electrodes, the pair of metal terminals being made of a metal having a low thermal conductivity, the end region of each of the pair of metal terminals being connected to an outermost layer of the at least two layers of a corresponding one of the pair of electrodes, the outermost layer of the pair electrodes being exposed at the cutout; and
    solder connecting the end region of a corresponding one of the pair of metal terminals to the outermost layer of a corresponding one of the pair of electrodes; wherein
    the cutout in at least one of the pair of metal terminals is aligned with the approximate center of the plate-like positive coefficient thermistor element; and
    the solder overflows the cutout onto an outer surface of the pair of metal terminals.

2. A surface-mount positive coefficient thermistor according to claim 1, wherein each of the pair of electrodes comprises a first layer including nickel as the primary component and a second layer including silver as the primary component, the area of the second layer being less than that of the first layer such that a peripheral edge of the second layer is spaced from a peripheral edge of a corresponding one of the two main surfaces.

3. A surface-mount positive coefficient thermistor according to claim 1, wherein the pair of metal terminals comprises at least one material selected from stainless steel and silver nickel.

4. A surface-mount positive coefficient thermistor according to claim 3, wherein the pair of metal terminals are plated to enhance solderability.

5. A surface-mount positive coefficient thermistor according to claim 4, wherein the pair of metal terminals are plated with tin.

6. A surface-mount positive coefficient thermistor according to claim 1, wherein the cutout is defined by a single substantially circular hole.

7. A surface-mount positive coefficient thermistor according to claim 1, wherein the cutout is defined by a single noncircular hole.

8. A surface-mount positive coefficient thermistor according to claim 1, wherein the cutout extends to a periphery of each of the pair of metal terminals.

9. A surface-mount positive coefficient thermistor according to claim 1, wherein the cutout is defined by a plurality of holes.

10. A surface-mount positive coefficient thermistor comprising:
    a plate-like positive coefficient thermistor element;
    a pair of electrodes provided on two main surfaces of the positive coefficient thermistor element, each of the pair of electrodes including at least two layers;
    a pair of metal terminals each having a cutout at one end region thereof connected to a corresponding one of the pair of electrodes, the pair of metal terminals being made of a metal having a low thermal conductivity, the end region of each of the pair of metal terminals being connected to an outermost layer of the at least two layers of a corresponding one of the pair of electrodes, the outermost layer of the pair electrodes being exposed at the cutout; and
    solder connecting the end region of a corresponding one of the pair of metal terminals to the outermost layer of a corresponding one of the pair of electrodes; wherein
    the cutout in at least one of the pair of metal terminals is aligned with the approximate center of the plate-like positive coefficient thermistor element; and
    the cutout is defined by a plurality of holes.

11. A surface-mount positive coefficient thermistor according to claim 10, wherein each of the pair of electrodes comprises a first layer including nickel as the primary component and a second layer including silver as the primary component, the area of the second layer being less than that of the first layer such that a peripheral edge of the second layer is spaced from a peripheral edge of a corresponding one of the two main surfaces.

12. A surface-mount positive coefficient thermistor according to claim 10, wherein the pair of metal terminals comprises at least one material selected from stainless steel and silver nickel.

13. A surface-mount positive coefficient thermistor according to claim 12, wherein the pair of metal terminals are plated to enhance solderability.

14. A surface-mount positive coefficient thermistor according to claim 10, wherein the solder overflows from the cutout onto an outer surface of the pair of metal terminals.

15. A surface-mount positive coefficient thermistor according to claim 10, wherein the pair of metal terminals are plated with tin.

16. A surface-mount positive coefficient thermistor according to claim 10, wherein the cutout is defined by a single substantially circular hole.

17. A surface-mount positive coefficient thermistor according to claim 10, wherein the cutout is defined by a single noncircular hole.

18. A surface-mount positive coefficient thermistor according to claim 10, wherein the cutout extends to a periphery of each of the pair of metal terminals.

* * * * *